(12) United States Patent
Heigl et al.

(10) Patent No.: US 11,307,248 B2
(45) Date of Patent: Apr. 19, 2022

(54) CONTACTING UNIT FOR A TEST HANDLER FOR PERFORMING FUNCTIONAL TESTS ON SEMICONDUCTOR ELEMENTS

(71) Applicants: Helmuth Heigl, Rohrdorf (DE); Hubertus Heigl, Rohrdorf (DE)

(72) Inventors: Helmuth Heigl, Rohrdorf (DE); Hubertus Heigl, Rohrdorf (DE)

( * ) Notice: Subject to any disclaimer, the term of this patent is extended or adjusted under 35 U.S.C. 154(b) by 144 days.

(21) Appl. No.: 16/406,655

(22) Filed: May 8, 2019

(65) Prior Publication Data
US 2019/0277911 A1    Sep. 12, 2019

(30) Foreign Application Priority Data

Mar. 8, 2018    (DE) .................... 10 2018 105 353.3

(51) Int. Cl.
*G01R 31/28* (2006.01)
(52) U.S. Cl.
CPC ..... *G01R 31/2891* (2013.01); *G01R 31/2874* (2013.01); *G01R 31/2893* (2013.01)
(58) Field of Classification Search
CPC ............ G01R 31/2601; G01R 31/2862; G01R 31/2863; G01R 31/2865; G01R 31/2874; G01R 31/2891; G01R 31/2893
See application file for complete search history.

(56) References Cited

U.S. PATENT DOCUMENTS

| 6,445,203 B1* | 9/2002 | Yamashita | G01R 31/2874 324/750.08 |
| 2005/0012498 A1* | 1/2005 | Lee | G01R 31/2886 324/750.08 |
| 2006/0244472 A1* | 11/2006 | Hayashi | G05D 23/19 324/750.08 |

(Continued)

*Primary Examiner* — Steven L Yeninas
(74) *Attorney, Agent, or Firm* — Andrew J. Anderson, Esq.; Harter Secrest & Emery LLP

(57) ABSTRACT

A contacting unit (30) for a test handler (100) for carrying out functional tests on semiconductor elements having a surface, in particular on ICs (200), has a contacting module (60). The contacting module (60) comprises an inlet (61) through which a semiconductor element (200) to be tested is introduced into the contacting module (60), a test chamber (62) in which the semiconductor element (200) to be tested is fixed in a test position and subjected to the functional test, a movably arranged plunger (63) for fixing the semiconductor element to be tested in the test position, a first temperature sensor (64) arranged on the plunger (63) for measuring the surface temperature at the surface of the semiconductor element (200) to be tested, an air supply (65) for introducing a temperature control current into the test chamber (62), a controller for setting the temperature of the temperature control current depending on the surface temperature, at least one flushing chamber (70a, 70b, 70c) for flushing the test chamber (62), the first temperature sensor (64) or the air supply (65) with flushing air, and an outlet (66) through which the semiconductor element (200) is guided out of the contacting module (60) after the functional test. Further- (Continued)

Figure 1:
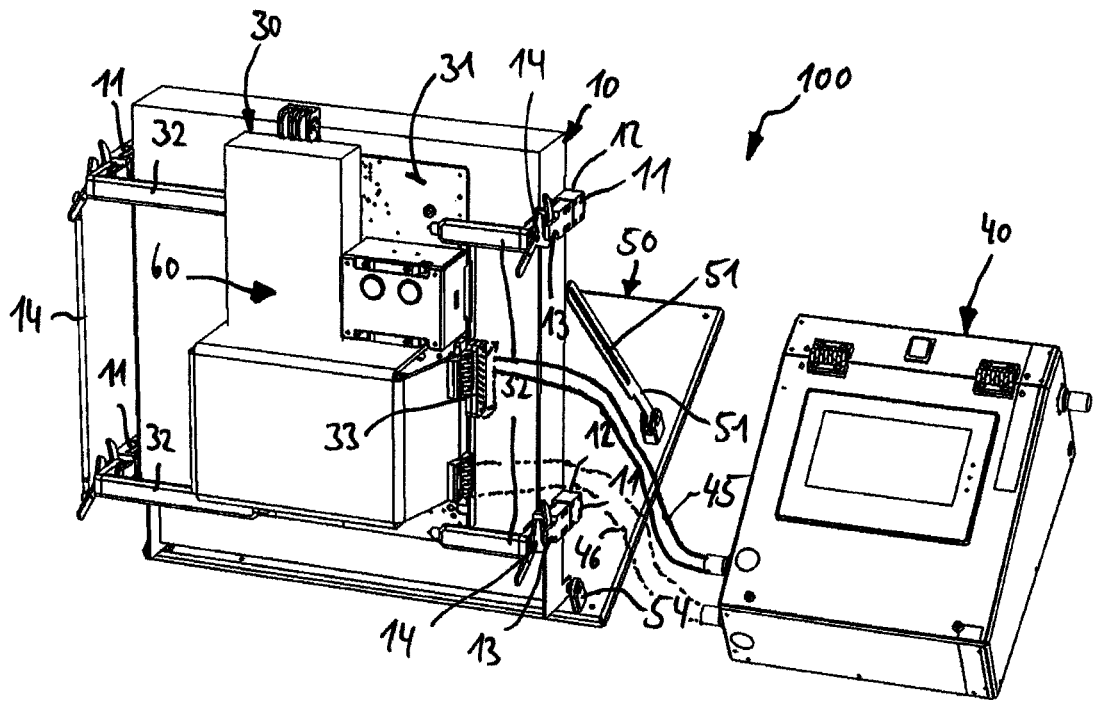

more, there is an air curtain at the inlet and outlet. In a method for controlling the contacting unit (30), the temperature of the temperature control current is controlled depending on the surface temperature.

24 Claims, 11 Drawing Sheets

(56) References Cited

U.S. PATENT DOCUMENTS

| | | | | |
|---|---|---|---|---|
| 2007/0005287 | A1* | 1/2007 | Zhang | G01R 31/2893 |
| | | | | 702/119 |
| 2007/0132471 | A1* | 6/2007 | Carlson | G01R 31/2874 |
| | | | | 324/750.09 |
| 2010/0303589 | A1* | 12/2010 | Schaule | G01R 31/2874 |
| | | | | 414/225.01 |
| 2011/0156734 | A1* | 6/2011 | Berry | G01R 31/2891 |
| | | | | 324/750.19 |
| 2012/0062261 | A1* | 3/2012 | Nelson | G01R 1/06744 |
| | | | | 324/755.09 |
| 2012/0311858 | A1* | 12/2012 | Reitinger | G01R 31/2874 |
| | | | | 29/837 |
| 2013/0220579 | A1* | 8/2013 | Yosef | F28F 3/12 |
| | | | | 165/104.21 |
| 2014/0232423 | A1* | 8/2014 | Pichl | G01R 31/2891 |
| | | | | 324/750.08 |
| 2016/0370423 | A1* | 12/2016 | Gauss | G01R 1/0675 |
| 2017/0030964 | A1* | 2/2017 | Barabi | G01R 31/2874 |
| 2019/0204378 | A1* | 7/2019 | Gopal | G01R 31/2875 |
| 2020/0191864 | A1* | 6/2020 | Suga | G01R 31/2829 |

* cited by examiner

CONTACTING UNIT FOR A TEST HANDLER FOR PERFORMING FUNCTIONAL TESTS ON SEMICONDUCTOR ELEMENTS

The invention relates to a contacting unit for a test handler for carrying out functional tests on semiconductor elements, in particular ICs. The invention also concerns a method of controlling such a contacting unit.

ICs are usually tested for their function after manufacture in order to rule out functional errors. For these functional tests, certain temperature ranges can be stipulated, which vary from −60° C. to +180° C. So-called test handlers are known for carrying out the functional tests, which guarantee the handling of the ICs during the functional tests as well as a suitable temperature control.

A basic distinction is made between test handlers that use the pick-and-place principle or the gravity principle. While the pick-and-place principle fixes and moves the ICs mechanically or by means of vacuum on a movable plunger, gravity handlers are aligned in such a way that the ICs are moved by gravity.

For testing and characterization at different temperatures, the IC is sometimes, for small to medium quantities, placed manually on a test socket and brought to the desired test temperature by means of a hood which is put over the test socket and supplied with a temperature-controlled gaseous medium. Instead of the air current, a temperature-controlled block can also be applied to the surface of the IC. After the test has been carried out, the test base together with the mounting board shall be heated in cold tests to prevent the formation of icing or condensation.

For example, a test handler is known from US 2012/0313657 A1. The test handler is provided with a temperature control unit that heats the IC by means of a heat-conducting block. The temperature of the IC is measured by means of a temperature sensor.

Further, EP 2 770 335 B1 reveals a device and method for testing semiconductor devices. The device comprises a probe mounted on a test base, positioning means for positioning the device in a test position, and a guide support mounted on the positioning means for pushing the apparatus against the test base. An insertion opening of the guide support is positioned next to the test base. A temperature control medium is supplied to the insertion port when the device is in the test position.

A test handler and test procedure for semiconductor devices are described in U.S. Pat. No. 9,207,272 B2. The test handler has a plurality of chambers forming a fluid path along which a coolant or heat medium circulates to change the temperature of the chambers between a first temperature less than room temperature and a second temperature higher than room temperature when testing semiconductor devices.

From US 2015/0309112 A1, a thermal head for semiconductor elements to be tested, so-called DUT, is known, comprising a cooling chamber for providing a cooling temperature, a metal plate located below the cooling chamber and contacting the surface of the semiconductor elements to be tested, and an air gap formed between the cooling chamber and the metal plate. A downward movement of the cooling chamber is activated by a pneumatic control mechanism. The semiconductor elements to be tested are cooled when the cooling chamber is brought into contact with the metal plate.

The invention is based on the task of proposing a contacting unit for a test handler and a method for controlling such a contacting unit, which enables fast and reliable temperature control of the semiconductor element to be tested. In addition, while being manufactured cost-effectively, the contacting unit should be able to be adapted to different IC designs and thus be adapted for the use with different test systems.

The task shall be solved by a contacting unit for a test handler according to claim 1, a contacting unit for a test handler according to claim 18, a method according to claim 19 and a method according to claim 21. Advantageous embodiments of the contacting unit and the method are the subject of claims 2 to 17 and 20.

A test handler, which has the contacting unit according to the invention, is used to carry out functional tests on semiconductor elements, in particular on ICs. The contacting unit has a contacting module. The contacting module comprises an inlet through which a semiconductor element to be tested is introduced into the contacting module, a test chamber in which the semiconductor element to be tested is fixed in a test position and subjected to the functional test, a movably arranged plunger for fixing the semiconductor element to be tested in the test position, a first temperature sensor arranged on the plunger or test socket for measuring the surface temperature at the surface of the semiconductor elements, an air supply for introducing a temperature control current into the test chamber, a controller for setting the temperature of the temperature control current depending on the surface temperature, at least one flushing chamber for flushing the test chamber, the first temperature sensor, the air supply and/or actuators for moving the plunger or a stop device with flushing air, and an outlet through which the semiconductor element is guided out of the contacting module after the functional test.

The contacting unit according to the invention may basically be used for both gravity handlers and pick-and-place handlers. Either by gravity, transported by air nozzles, or by means of a positioning device such as a grappler, the semiconductor element passes through the inlet to the contacting module and then into the test chamber, where it is fixed in the test position. In the test chamber, the semiconductor element is subjected to the functional test and, if necessary, brought to the respective test temperature. The surface temperature of the semiconductor element is measured directly on the surface by means of the first temperature sensor, which is advantageously arranged on the plunger, i.e. the first temperature sensor preferably gets in contact with the surface of the semiconductor element. By means of the controller, the temperature of the temperature control current is set according to the invention depending on the surface temperature measured by the first temperature sensor in order to achieve the desired temperature of the semiconductor element. After the functional test, the semiconductor element is removed from the contacting module by gravity, mechanically by a sliding mechanism or with the aid of air nozzles through the outlet. The flushing chamber prevents icing or excessive heating of the contacting module.

By contacting the first temperature sensor and feeding the temperature-controlled temperature control current directly to the IC, very fast and accurate temperature control of the semiconductor element to be tested is possible. This facilitates speedy testing of semiconductor elements. Furthermore, owing to the compact design of the contacting module and in particular of the test chamber, only a low temperature control current is required to heat or cool the test chamber.

In addition to fast and reliable temperature control, the contacting unit according to the invention provides a cost-effective way of performing the electrical test of the semiconductor element to be tested, which can be easily adapted to different IC designs and used for different test systems.

The contacting unit advantageously includes a guide unit for guiding the semiconductor element to be tested within the contacting module. It is advisable for the guide unit to have a test socket forming the test position in the region of the test chamber. For example, the guide unit may either completely or partially be essentially U-shaped, thereby forming a groove in which the semiconductor element is moved within the contacting module. The test socket is used to position the semiconductor element at the test position on contacting elements.

In an advantageous embodiment, the guide unit is designed as a guide rocker and is mounted at least in the region of the test chamber by means of at least one spring, wherein the guide unit together with the semiconductor element to be tested can be moved through the plunger towards the spring in order to compress the spring. In particular, the guide rocker may be open towards a bottom, so that the IC can be contacted at its bottom side, i.e. at the side facing away from the plunger, through the opening of the guide rocker, for example by another temperature sensor. The plunger provides the necessary counter pressure.

Advantageously, the guide unit extends from the inlet via the test chamber to the outlet. This ensures safe guiding of the semiconductor elements within the contacting module over their entire path.

Preferably, the contacting unit comprises at least one nozzle for introducing a flow into the guide unit to move the semiconductor element to be tested along the guide unit. The nozzle is preferably oriented such that it produces a flow in the direction in which the guide unit extends. Preferably, the nozzle is arranged close to the opening of the guide unit and, for example, close to the inlet.

Preferably, the first temperature sensor is biased by a spring and mounted in the plunger, preferably the plunger being arranged in such a manner that it faces a top face or a bottom face of the semiconductor element to be tested when the latter is in the test position. The first temperature sensor can therefore press directly on the surface of the semiconductor element in order to obtain the most accurate measurement possible of the surface temperature. The plunger and the first temperature sensor may be located on any side of the test socket or of the test position, in particular they may be located on the top or bottom of the test socket or test position. In addition, one plunger and one temperature sensor can be located on each opposite side of the test base or test position so that on two sides of the semiconductor element the temperature can be measured simultaneously or—depending on the design of the semiconductor element—selectively.

Preferably, the contacting unit comprises a movably arranged, preferably spring-loaded cross member which moves the plunger towards the test position to fix the semiconductor element to be tested in the test position. The cross member is preferably actuated by at least one ram, which is in particular made of a temperature-stable material. The force can preferably be transmitted by at least one pneumatic cylinder, preferably air-flushed. The cross member may, for example, be designed as a block and fit snugly against the plunger. When the cross member is actuated by means of the ram, the cross member moves the plunger and thus the first temperature sensor towards the test position, so that the semiconductor element is fixed in the test position.

The contacting unit preferably comprises a sensor, in particular a light sensor, for determining whether the semiconductor element to be tested is arranged in the test position. This allows the test cycle to begin as soon as the semiconductor element has been detected in the test position.

Preferably, the contacting module has a base and a hood detachably connected to the base. For practical purposes, the base and hood are enclosing the test chamber. The hood can thus be easily removed from the base in order, for example, to eliminate a mechanical fault in the contacting module or to test at room temperature. The base and hood can be screwed together, or the base and/or hood can be provided with at least one quick-release fastener to make it easier to remove and place the hood on the base.

Advantageously, the base, the hood or the ram are made of a temperature-stable plastic to ensure exact temperature control with a lightweight design. Thermoplastic plastics that are particularly suitable for the base and the hood, but also for the ram, are for example thermoplastic plastics such as polyether ether ketone (PEEK) or polyphenylene sulfide (PPS), which are particularly glass fibre-reinforced.

Advantageously, the air supply is oriented such that it directs the temperature control current to the test position and thus to control the temperature of the semiconductor element in the test position. In particular, the air supply may be oriented to direct the temperature control current approximately in the direction of movement of the semiconductor element to the test position. This allows a very stable temperature to be achieved on the surface of the semiconductor element. In addition, it is easier to move or accelerate the semiconductor element in the direction of the outlet after the functional test.

Preferably, the contacting unit comprises at least one air connection for introducing preferably temperature-controlled flushing air into the flushing chambers.

Advantageously, the contacting unit comprises an air outlet for discharging the temperature control current from the contacting module, wherein the air outlet is preferably directed upwards and away from the contacting unit in the operating state of the contacting unit. In this way, the temperature control current flows away from the air outlet and from the contacting unit so that icing or humidification of the outer walls is prevented.

Advantageously, the contacting unit comprises a movably arranged stopping device which stops the semiconductor element to be tested when it reaches the test position, wherein the stopping device is preferably actuated by at least one ram made of a temperature-stable material. The power transmission may preferably be effected by at least one pneumatic cylinder, which is preferably air-flushed.

Preferably, the contacting unit comprises a transition region which can be flushed with air by means of the flushing chamber, the transition region preferably forming a transition to a test board.

In an advantageous embodiment, the inlet and/or the outlet are shielded against extraneous air by means of an air curtain formed by flushing air. Thus the contacting module remains free of ambient air, which would disturb the temperature control in the test chamber in particular.

Advantageously, the contacting unit has a second temperature sensor for measuring the air temperature in the test chamber. The second temperature sensor is positioned in particular in the region of the test socket to measure the air temperature prevailing in the test chamber. Preferably the second temperature sensor is arranged in such a way that the air temperature in the air current is measured. Alternatively, this air current can also be reduced to zero, so that a static state of the IC can be simulated without air flushing at ambient temperature. The second temperature sensor does not contact the IC. If a first temperature sensor and a second temperature sensor are present, the temperature of the temperature control current can be set depending on the surface temperature or the air temperature or depending on the surface temperature and the air temperature.

The second temperature sensor opens up additional possibilities for testing ICs. By using the second temperature sensor, the air temperature in the region of the test socket can be measured in addition to the temperature at the IC. This allows ICs to be tested at a constant temperature in the test chamber, for example −40° C., using the second temperature sensor as the reference for control. This can be used to test how an IC behaves during the electrical test at a stable air temperature. The system no longer readjusts, since the heating of the IC, for example caused by a current supply to the IC, does not influence the measurement result of the second temperature sensor.

The second temperature sensor provides further test possibilities at room temperature, hot temperature, cold temperature and various flow rates of the thermosystem. For example, it allows you to test the minimum air flow required to limit the heating of the IC to a certain temperature.

The invention also concerns a contacting unit for a test handler for carrying out functional tests on semiconductor elements having a surface, in particular on ICs. The test handler has a contacting module comprising a test chamber in which the semiconductor element to be tested is subjected to the functional test, a first temperature sensor for measuring the surface temperature at the surface of the semiconductor element to be tested, a second temperature sensor for measuring the air temperature in the test chamber, an air supply for introducing a temperature control current into the test chamber and a controller for adjusting the temperature of the temperature control current as a function the surface temperature or the air temperature.

Figure 2A:
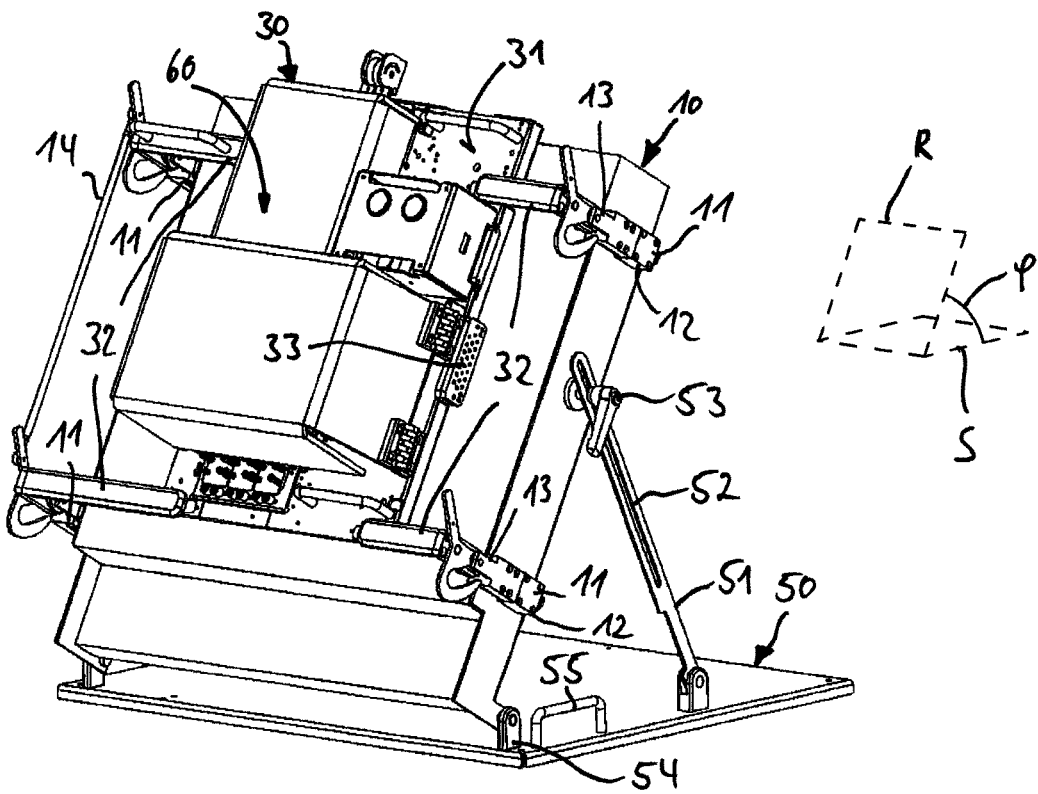
Figure 2B:
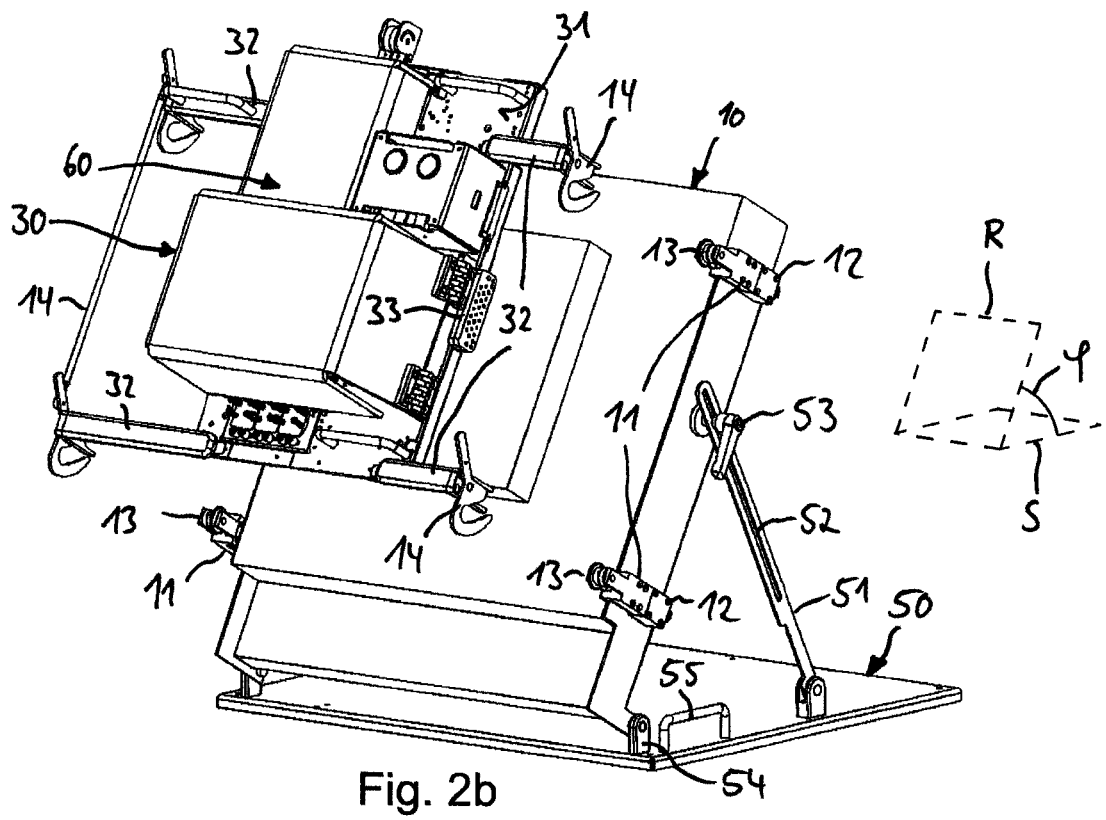
Figure 3:
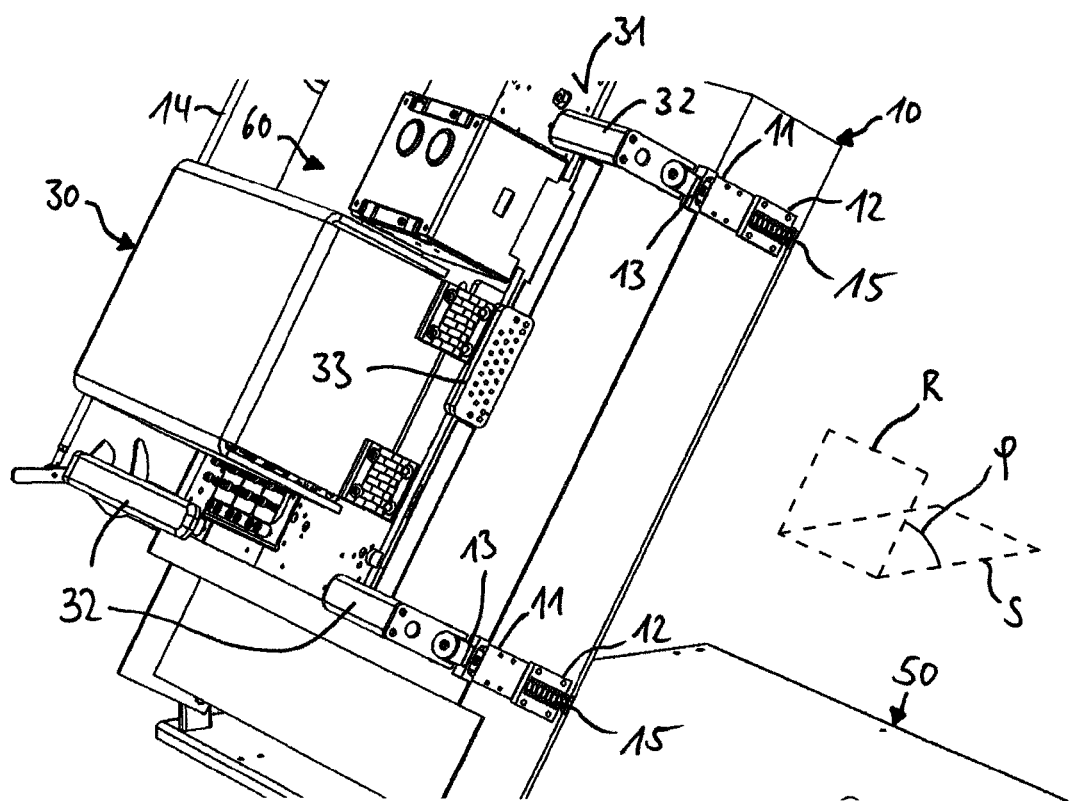
Figure 4A:
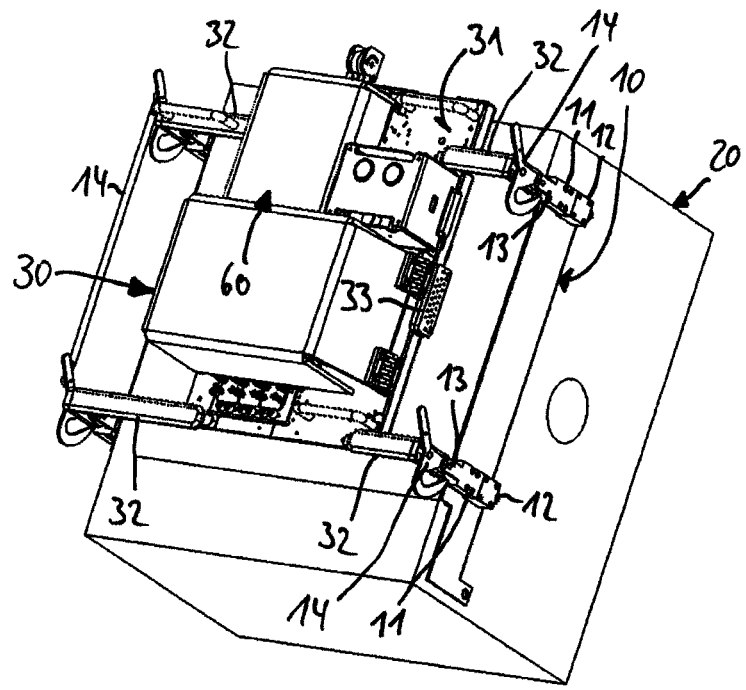
Figure 4B:
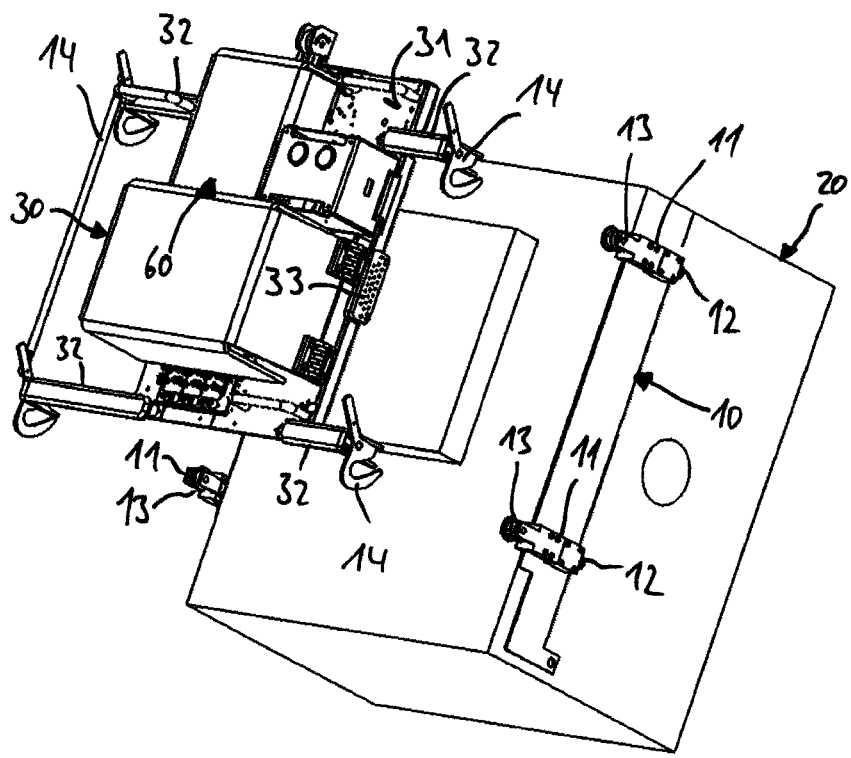
Figure 5A:
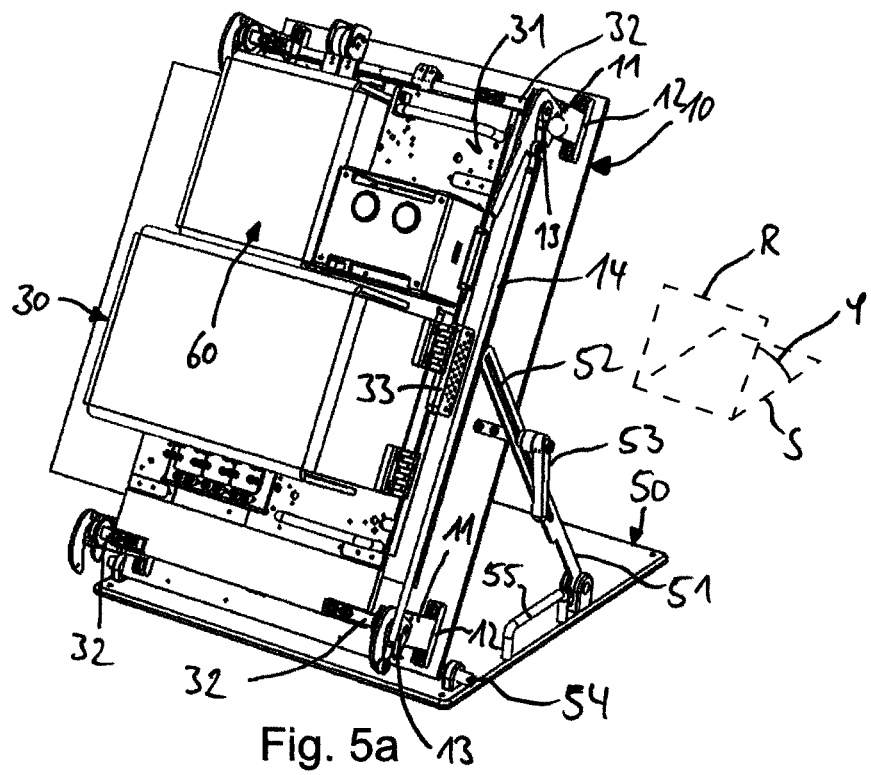
Figure 5B:
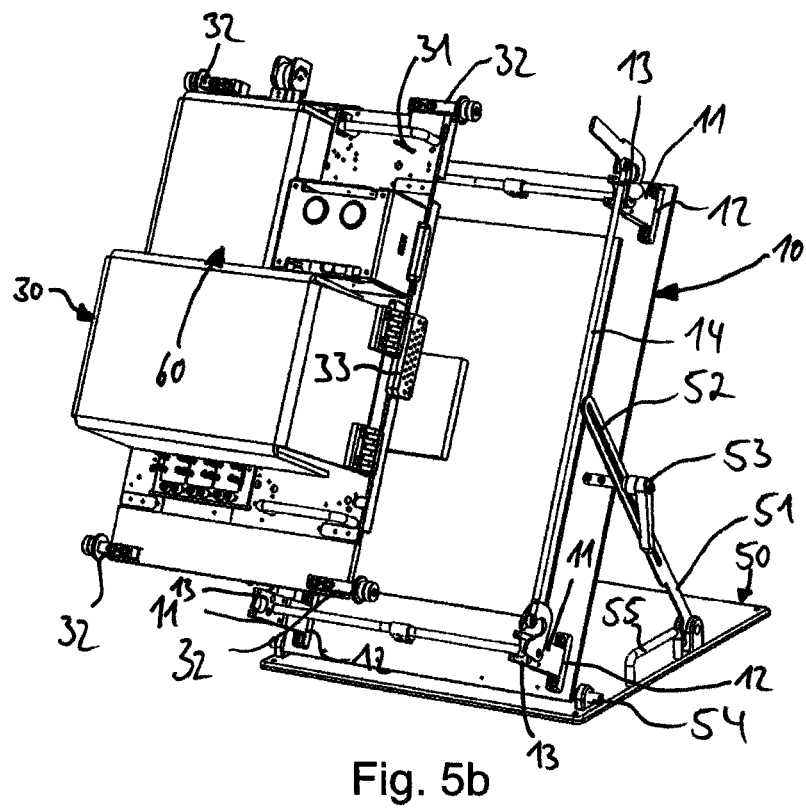
Figure 6:
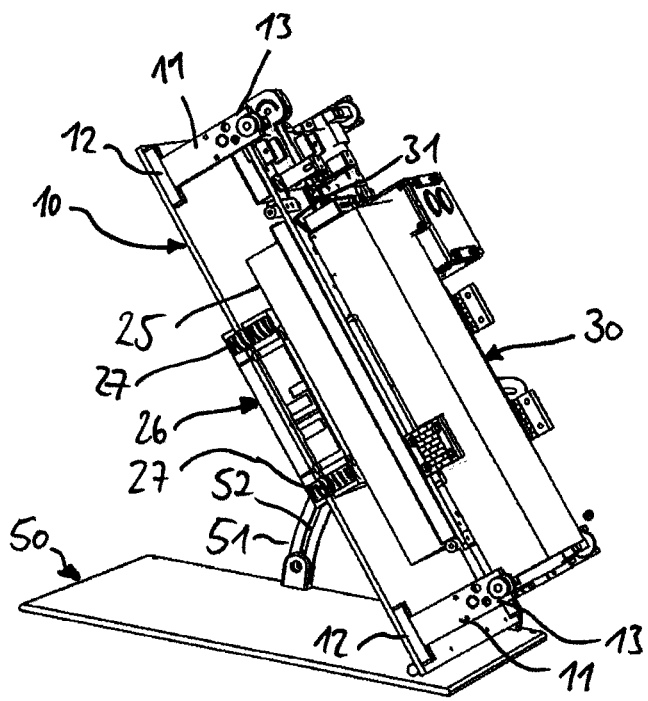
Figure 7A:
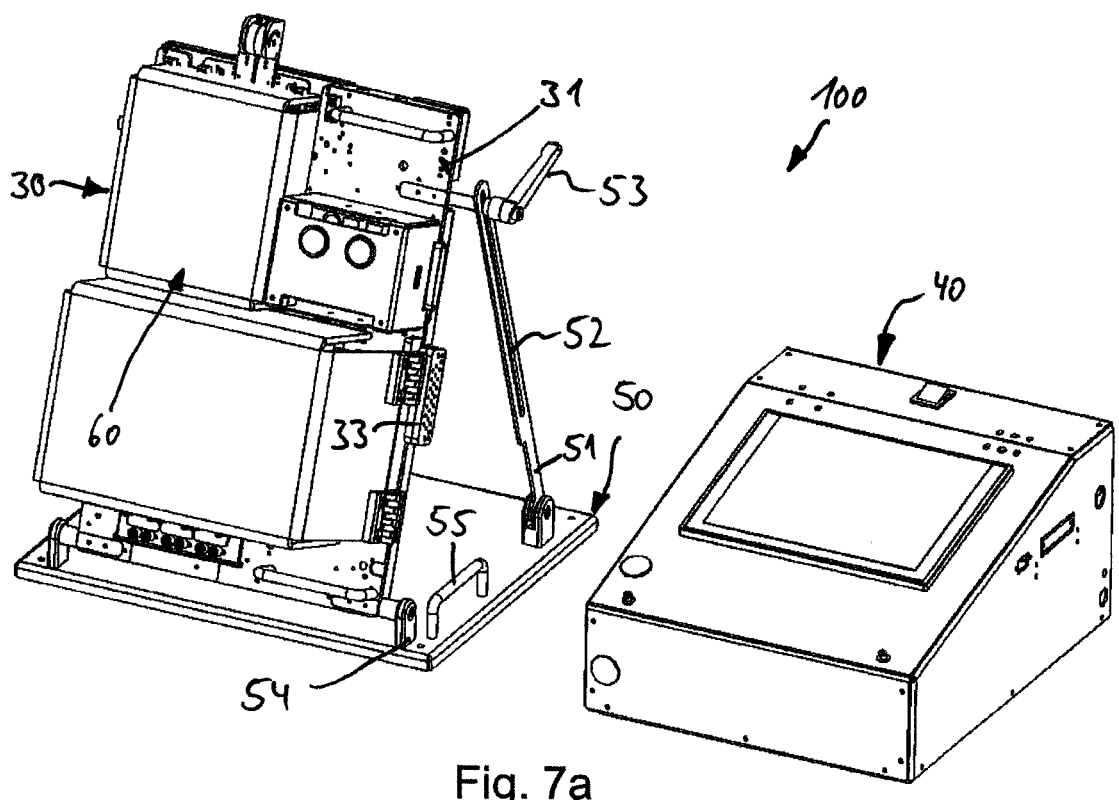
Figure 7B:
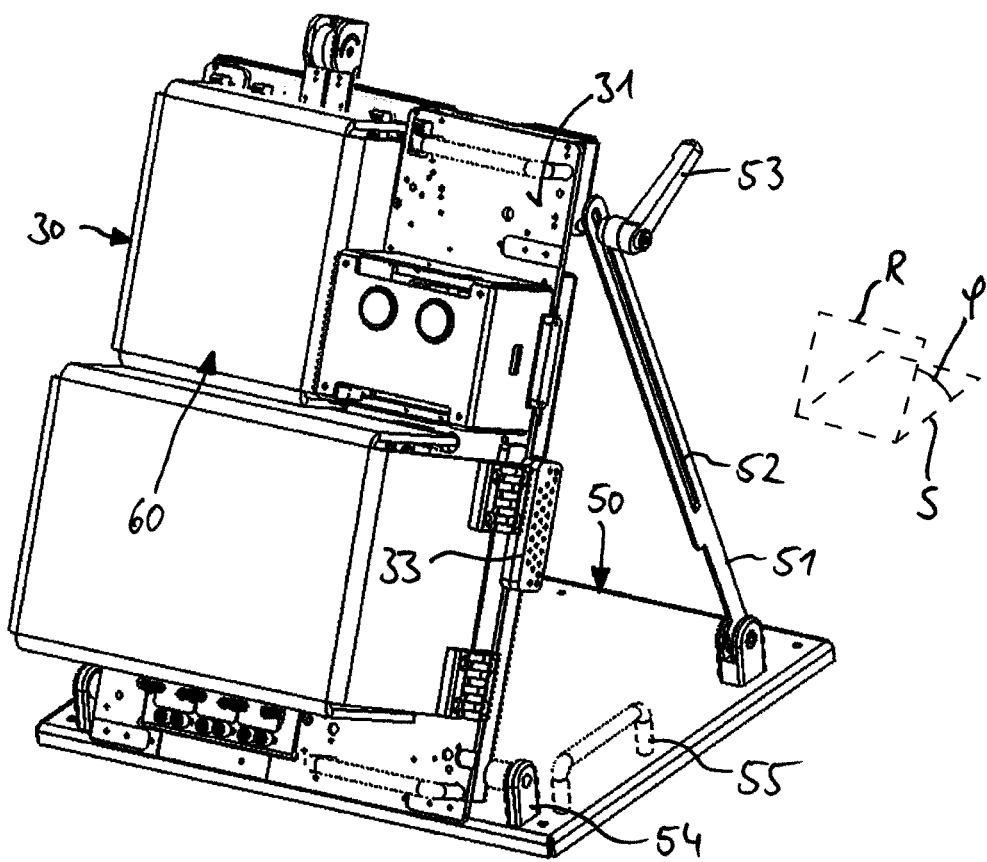
Figure 8:
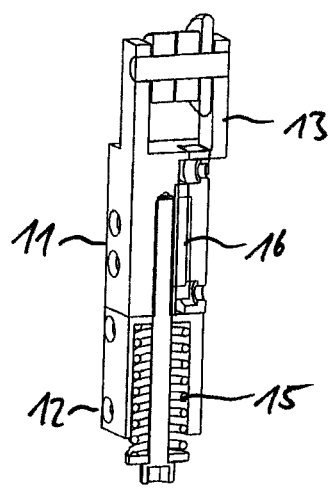
Figure 9:
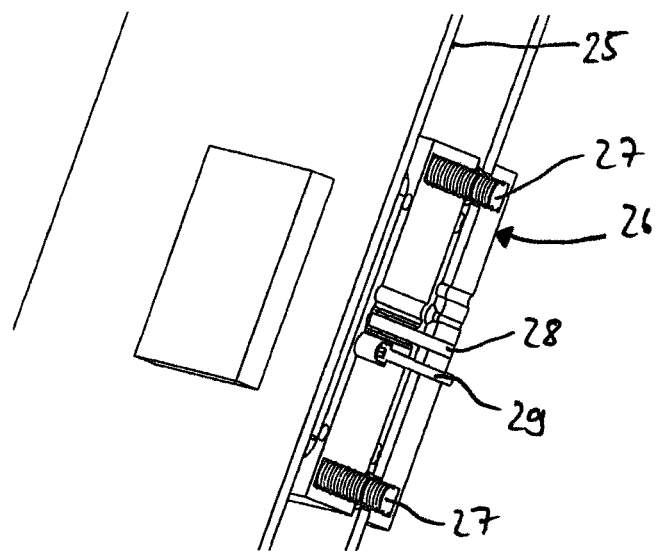
Figure 10A:
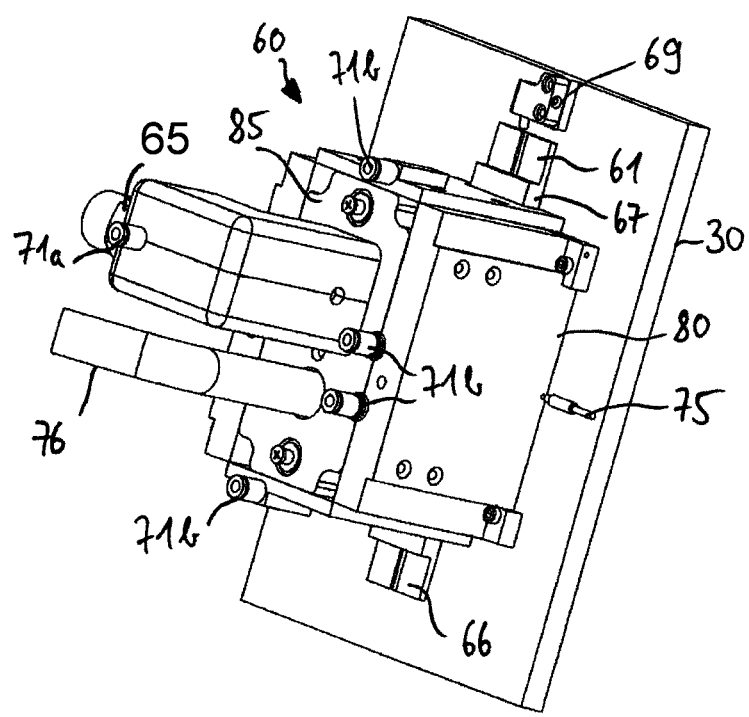
Figure 10B:
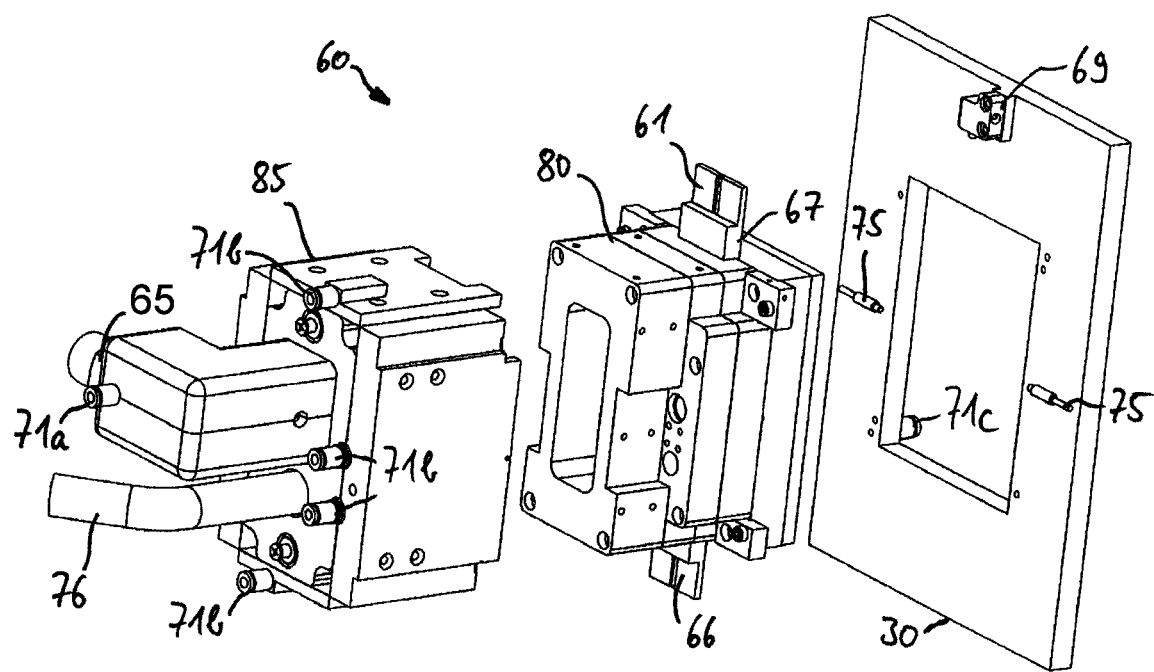
Figure 11:
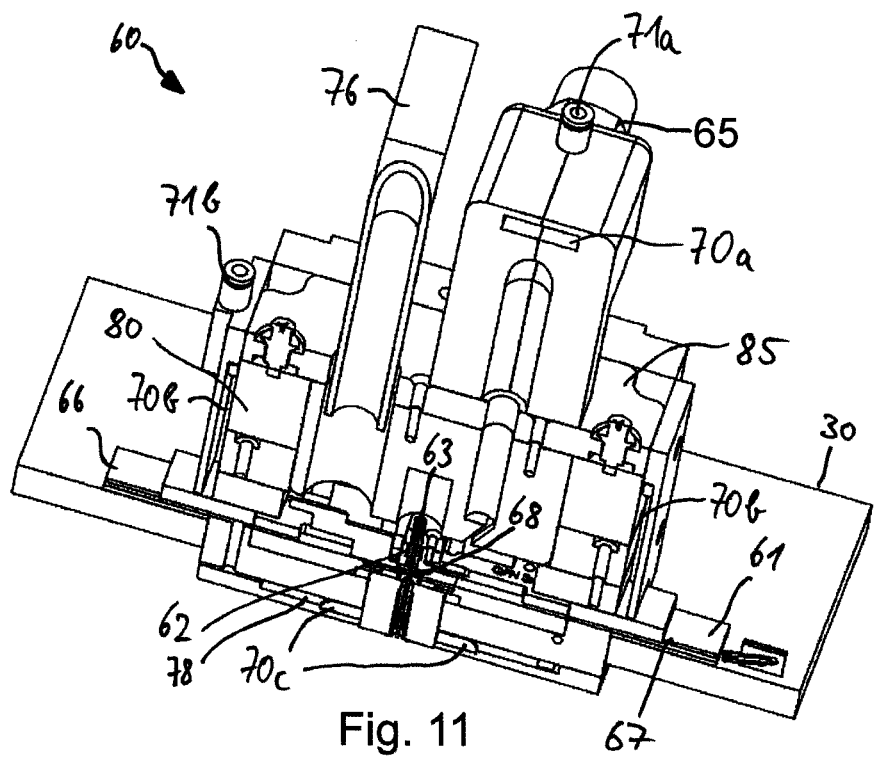
Figure 12A:
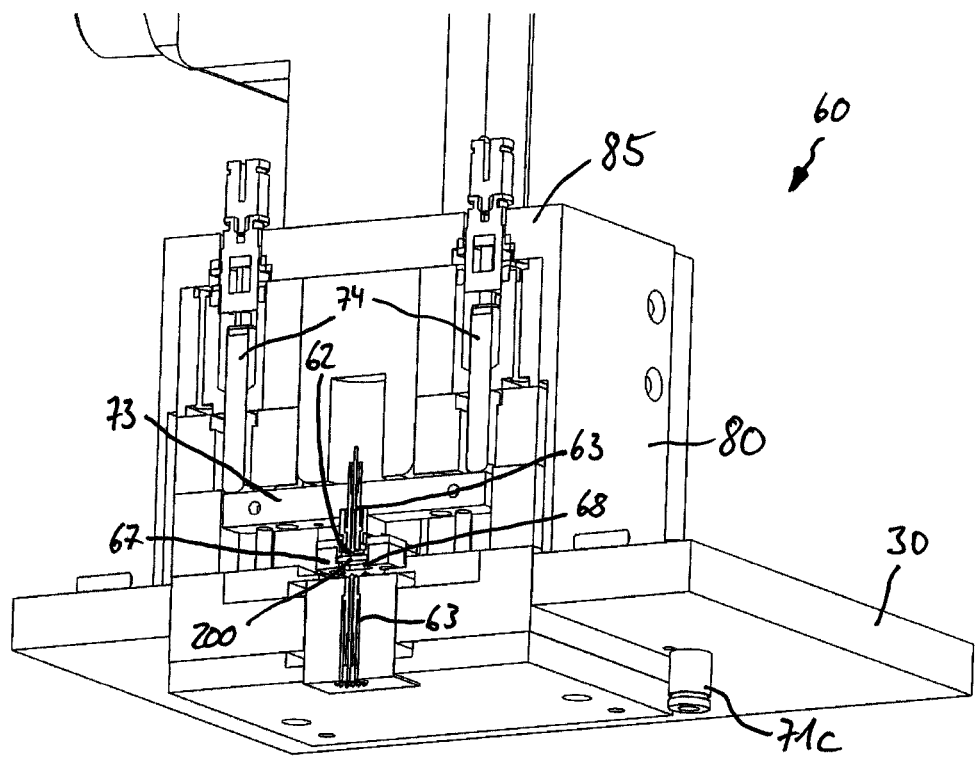
Figure 12B:
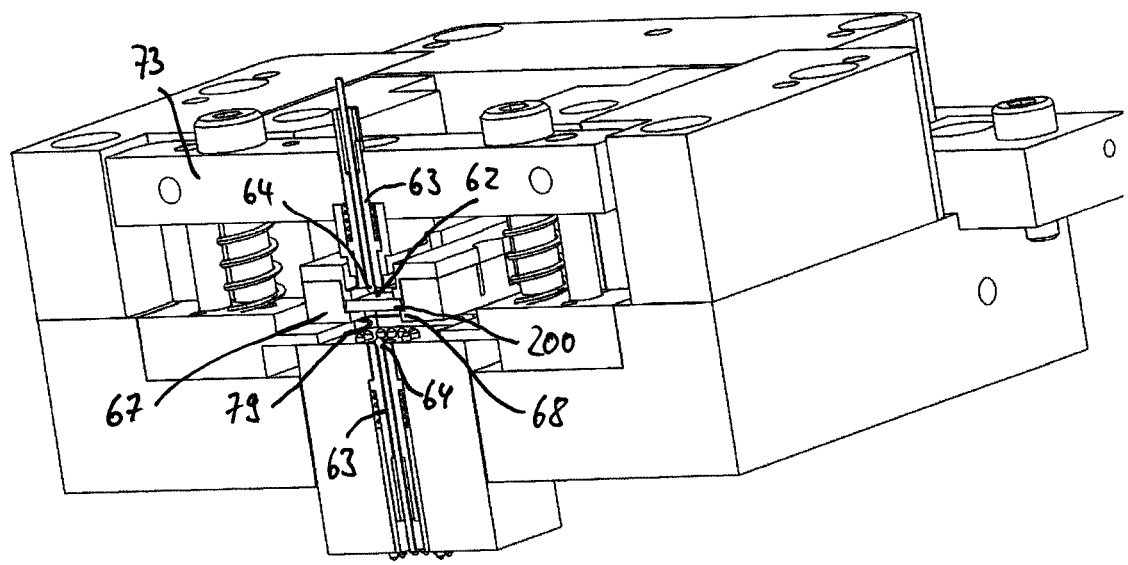
Figure 13:
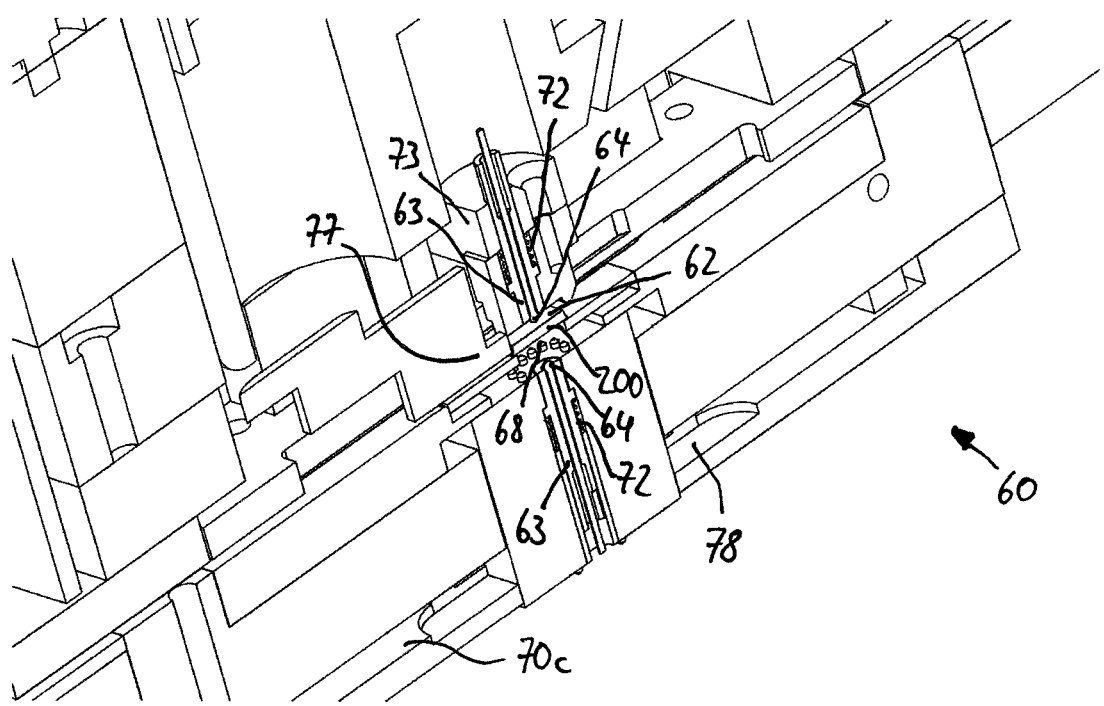
Figure 14:
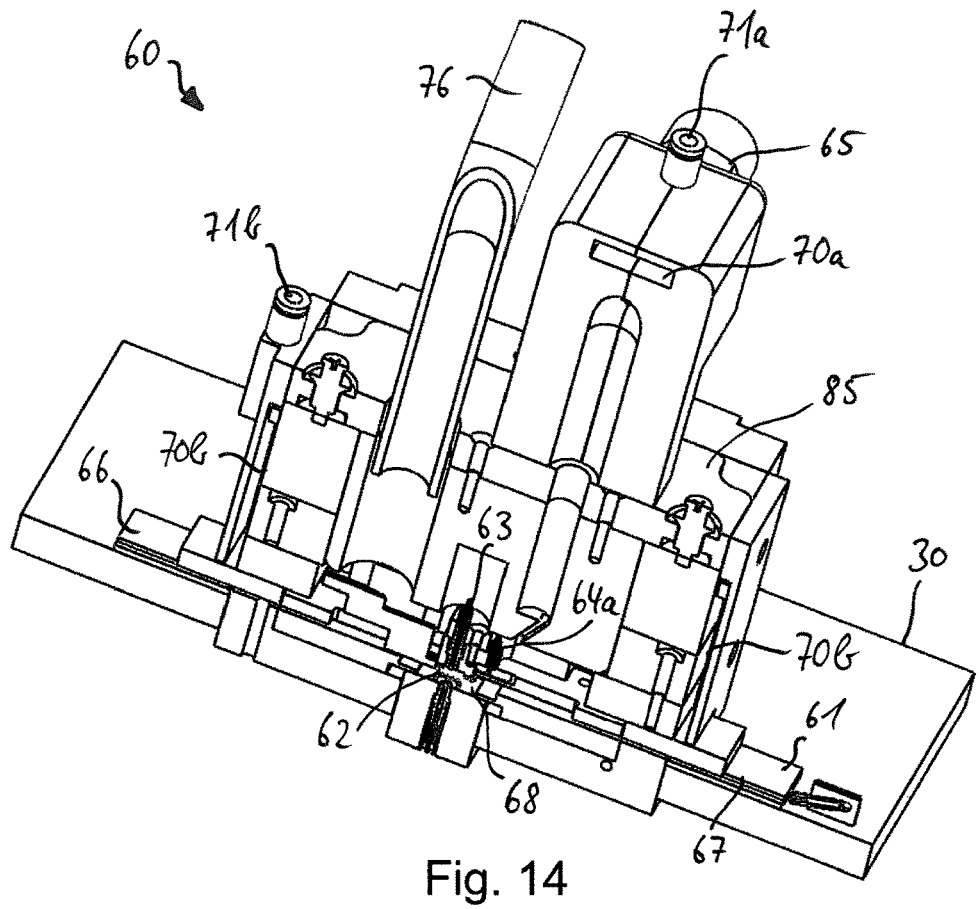
Figure 15:
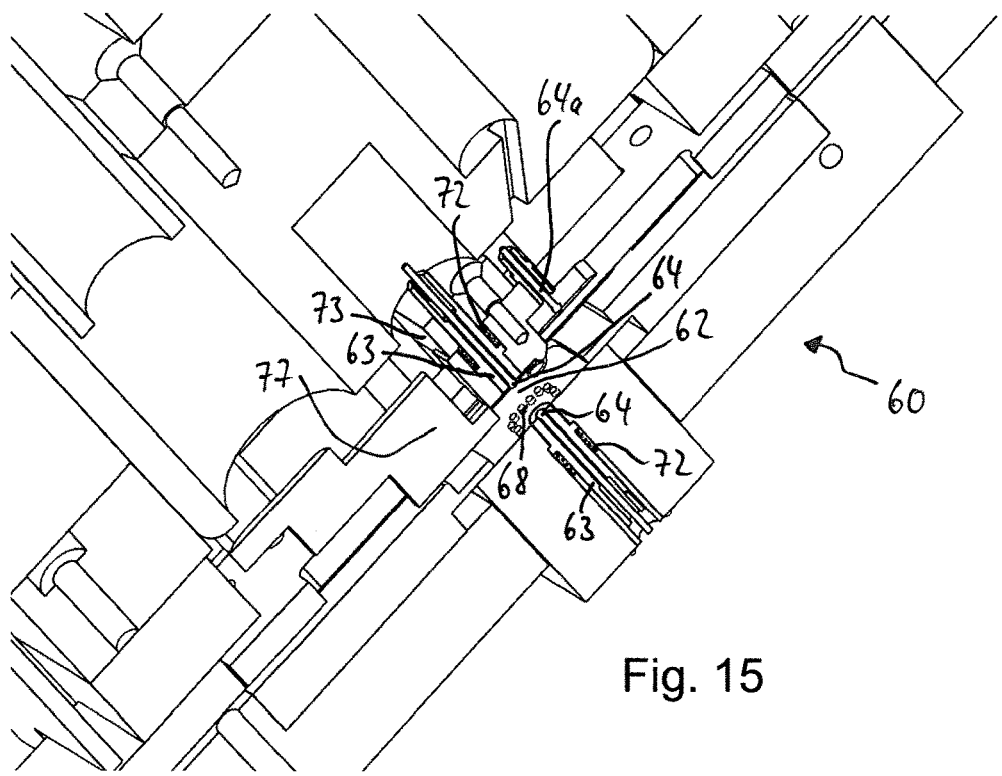

In the following, the invention is described using exemplary embodiments. In the drawings are shown:

FIG. 1 a perspective view of a first exemplary embodiments of a test handler having the contacting unit according to the invention;

FIG. 2a a perspective view of the test handler of FIG. 1 without supply unit;

FIG. 2b a perspective view of the test handler of FIG. 2a in which a handler unit is shown separately from a carrier unit;

FIG. 3 a perspective view of the test handler of FIG. 2a, in which support elements are shown in a sectional view;

FIG. 4a a perspective view of a second exemplary embodiment of a test handler having the contacting unit according to the invention;

FIG. 4b a perspective view of the test handler of FIG. 4a, wherein a handler unit is shown separately from a probe;

FIG. 5a a perspective view of a third exemplary embodiment of a test handler having the contacting unit according to the invention;

FIG. 5b a view of the test handler of FIG. 5a, wherein a handler unit is represented separately from a carrier unit;

FIG. 6 a sectional view of the exemplary embodiment according to FIGS. 5a and 5b;

FIG. 7a a perspective view of a fourth exemplary embodiment of a test handler having the contacting unit according to the invention;

FIG. 7b a perspective view of the test handler of FIG. 7a without supply unit;

FIG. 8 a sectional view of a support element;

FIG. 9 a sectional view of a spring module;

FIG. 10a a perspective view of a contacting module;

FIG. 10b an exploded view of the contacting module of FIG. 10a;

FIG. 11 a sectional view through the contacting module;

FIG. 12a a further cross-sectional view through the contacting module;

FIG. 12b an enlarged view of the region of the test chamber of the contacting module of FIG. 12a;

FIG. 13 a further cross-sectional view through the contacting module;

FIG. 14 a sectional view through a contacting module which has a second temperature sensor, and FIG. 15 a further sectional view through the contacting module which has a second temperature sensor.

FIG. 1 to FIG. 7b show different exemplary embodiments of test handlers which have the contacting unit according to the invention. A first exemplary embodiment of a test handler 100 for carrying out functional tests on semiconductor elements, in particular on ICs 200, is shown in FIG. 1. The test handler is designed as a gravity handler and comprises a handler unit 34, a supply unit 40, a carrier unit 10 and a stand 50. The handler unit 34 comprises a contacting unit 30. The carrier unit 10 accommodates test electronics which are necessary for carrying out functional tests and are supplied with electrical energy. The handler unit 34 provides the semiconductor elements 200 in at least one test position and sorts them depending on the result of the functional test. The supply unit 40 is used to supply the handler unit 34 with electrical and/or pneumatic energy. For this purpose, the handler unit 34 and the supply unit 40 are connected to each other via cables 45 and/or hoses 46 as well as via a connector 33. The handler unit 34 and the supply unit 40 are spatially separated from each other in order to decouple the mechanical handling of the semiconductor elements 200 from the control and the pneumatics. This allows a smaller and lighter construction of the handler unit 34 and the contacting unit 30.

The spatial separation of the supply unit 40 from the handler unit 34 means that the control unit and the pneumatics are separated from the handling of the ICs 200. This results in a very low weight of the handler unit 34. In addition, the separation of supply unit 40 and handler unit 34 significantly reduces the dimensions of handler unit 34. The handler unit 34 may be designed extremely flat, particularly compared to known test handlers.

The carrier unit 10 has four support elements 11, which are shown in an enlarged view in FIG. 8. The support elements 11 each comprise a foot section 12, a head section 13, a preloaded spring 15 and a linear guide 16. The support elements 11 are connected to the support unit 10 at the foot section 12. The linear guide 16 guides the support element 11 linearly along the carrier unit 10 when the support element 11 is loaded and the spring compression process takes place, so that jamming of the support element 11 is prevented. The handler unit 34 has four connecting elements 32. The head sections 13 of the support elements 11 each serve to accommodate a connecting element 32.

The connecting elements 32 are arranged in such a way that they can each be engaged with one support element 11 of the carrier unit 10. The handler unit 34 is connected to the carrier unit 10 via the connecting elements 32 and the support elements 11. The connection of the connecting elements 32 with the support elements 11 can be locked by means of a lock 14. The locking device 14 is designed as a rotating hook which is attached to the connecting elements 32 and can engage in the supporting elements 11.

The stand 50 defines a stand level S. The handler unit 34 has a surface 31 which defines a reference plane R. The reference plane R and the stand plane S include an angle of inclination φ.

The stand 50 includes a handle 55 for transporting the stand 50 and an angle adjustment 51 which has a guide 52. It is advisable to design guide 52 as a slotted hole, which is provided in the angle adjustment 51. In addition, the stand 50 has a pivot bearing 54. The carrier unit 10 is connected to the stand 50 at the pivot bearing 54 in a hinged manner. As shown in particular in FIG. 2a and FIG. 2b, a pin is arranged on the carrier unit 10 which engages in the guide 52 of the angle adjustment 51. By means of the hinged connection on the pivot bearing 54 and the pin guided in the guide 52, the carrier unit 10, and thus the handler unit 34, can be inclined in relation to the stand 50, so that the angle of inclination φ can be changed. Furthermore, the angle adjustment 51 is provided with a locking device 53 to fix the angle of inclination φ after it has been changed. The angle adjustment 51 thus enables a simple, fast and defined adjustment of the angle of inclination φ.

Changing the angle of inclination φ changes the orientation of the handler unit 34. By setting the angle of inclination 100, the movement of the IC 200 within the handler unit 34, in particular in the contacting unit 30, can be specifically influenced. The angle of inclination φ can be set so that a sliding plane for the ICs 200 is steep or flat. If the sliding plane is steep, fast movement and high acceleration of the IC 200 is possible within the handler unit 34 or in the contacting unit 30. If the sliding plane is flat, the IC 200 moves more slowly through the handler unit 34 or through the contacting unit 30 and is accelerated less strongly. The IC 200 is thus moved gliding in the gliding plane and not falling.

FIG. 4a and FIG. 4b show an exemplary embodiment of the test handler 100 in which the latter has a carrier unit 10 for attachment to a probe 20. The carrier unit 10 is designed as a frame which is attached to the probe 20. The probe 20 includes the test electronics. In this exemplary embodiment, the handler unit 34 can also be inclined in such a way that the orientation of the sliding plane is changed in relation to the direction of action of gravity. In this case, for example, the probe 20 may be rotatably mounted in an manipulator, which is not shown. By adjusting the inclination of the probe 20 via the manipulator, the inclination of the handler unit 34 and thus the orientation of the sliding plane is inevitably changed.

As FIG. 6 shows, the carrier unit 10 can have a spring module 26. A test board 25 is mounted on the spring module 26, which includes the test electronics. The spring module 26 is provided with several preloaded springs 27 to support the test board 25 on the carrier unit 10. As further illustrated in particular in FIG. 9, the spring module 26 has a screw 29 for adjusting the pretension of the springs 27. In addition, the spring module 26 is provided with a linear guide 28. The spring 27 and the linear guide 28 allow a safe and defined storage of the test board 25.

FIGS. 7a and 7b show an example of how the test handler 100 works without the carrier unit 10. In this case the handler unit 34 is directly connected to the stand 50 by means of the pivot bearing 54 so that a particularly compact design is available. In this example, the test electronics are provided externally, for example via an rack, which is not shown, in which the test electronics are installed.

FIG. 10a to FIG. 13 show a contacting module 60 which is part of the contacting unit 30 of the test handler 100. The contacting unit 30 or the contacting module 60 can, for example, be screwed to the handler unit 34 or connected to the latter by means of quick-release fasteners. The complete contacting unit 30 or only the contacting module 60 may be used for gravity handlers as well as for pick-and-place handlers.

The contacting module 60 comprises an inlet 61, a test chamber 62, a movable plunger 63, a first temperature sensor 64 disposed on the plunger 63, an air supply 65, flushing chambers 70a, 70b, 70c, an outlet 66, an regulator, which is not shown, and an air outlet 76. ICs 200 to be tested pass through inlet 61 into the contacting module 60. From the inlet 61, ICs 200 are moved by gravity, or in the case of a pick-and-place handler by a positioning device such as a grappler, through the contacting module 60. In order to guide the movement of the ICs 200 specifically through the contacting module 60, the contacting module 60 has a guide unit 67. The guide unit 67 has a test socket 68 in the region of the test chamber 62, which forms the test position. The guide unit 67 extends from the inlet 61 through the test chamber 62 to the outlet 66. The guide unit 67 may either completely or partially be essentially U-shaped to form a groove in which the IC 200 is moved within contacting module 60. To this end, it is particularly advantageous if the groove is matched to the dimensions of the IC 200 to be tested in order to ensure precise guidance of the IC 200 in the guide unit 67.

As in particular FIG. 12b clearly shows, the guide unit 67 is designed as a guide rocker and mounted in the region of the test chamber 62 by means of two springs 79. The guide unit 67 can be moved with the semiconductor element 200 to be tested by means of the upper plunger 63 to the springs 79. This compresses the springs 79. The guide rocker is open towards its bottom, so that the IC 200 to be tested, when in the test position, can be contacted at its bottom side, i.e. at the side facing away from the upper plunger 63 and facing the lower plunger 63, through the opening in the guide rocker, so that the temperature sensor 64 provided on the lower plunger 63 can also contact the IC 200. The upper plunger 63 provides the necessary counter-pressure.

The contacting unit 30 further comprises a nozzle 69. The nozzle 69 is located immediately adjacent to the inlet 61 and is oriented to generate a flow in the direction of the guide unit 67. The flow should further accelerate the motion of the IC 200 along its guiding unit 67. The nozzle 69 is located immediately adjacent to the opening of the guide unit 67 and close to the inlet 61.

From the inlet 61, the IC 200 passes into the test chamber 62. In the test chamber 62, the IC 200 is fixed in the test position, in particular at the test socket 68, and subjected to the functional test. In particular in the case of a gravity handler, it is advantageous if, as shown in FIGS. 11 and 13, a movably arranged stop device 77 is provided which stops the IC 200 to be tested when it reaches the test position. The stop device 77 is preferably actuated by at least one ram made of a temperature-stable material, wherein the power transmission can be effected by at least one pneumatic cylinder. In order to detect when the test position is occupied, i.e. when the IC 200 to be tested is in the test position, the contacting unit 30 is provided with a light sensor 75. As soon as the IC 200 is detected in the test position by the light sensor 75, the IC 200 can be fixed and the functional test can be started.

After the IC 200 has reached the test position, it is fixed in the test position by the plunger 63. The plunger 63 is provided with a first temperature sensor 64, as described above. The first temperature sensor 64 engages directly at the surface of the IC 200 in order to achieve an accurate measurement of the surface temperature of the IC 200. For this purpose, the first temperature sensor 64 is biased by a spring 72 and mounted in the plunger 63. The plunger 63 and the first temperature sensor 64 may be located on any side of the test socket 68 or the test position, or one plunger 63 and one temperature sensor 64 may be located on each opposite side of the test socket 68 or the test position, as shown in FIGS. 11 to 13.

The movement of the plunger 63 towards the test position is carried out by means of a movably arranged cross member 73, which receives the plunger 63 positively. The movement of the cross member 73 towards the test position is stimulated by at least one ram 74 made of a temperature-stable material. For example, the force can be transmitted by at least one pneumatic cylinder. As in particular FIG. 12a shows, in particular two rams 74 may be provided.

The temperature of the temperature control current can be set depending on the measured surface temperature of the IC 200 by contacting the IC 200 with the first temperature sensor 64 and the controller, which is not shown. This ensures a very fast and extremely accurate adjusting of the temperature of the IC 200. This facilitates a fast testing of semiconductor elements 200. Furthermore, the compact design of the contacting module 60 and in particular of the test chamber 62 means that only a low temperature control current is required to heat or cool the test chamber 62. In the test chamber 62, the IC 200 is released after the functional test has been carried out and exits the contacting module 60 through outlet 66.

A contacting module 60, which has a second temperature sensor 64a for measuring the air temperature in the test chamber 62, is clearly shown in FIGS. 14 and 15. The second temperature sensor 64a measures the air temperature prevailing in the test chamber 62. The ICs are not contacted.

If the controller uses the measured value of the second temperature sensor 64a as reference value, testing can be carried out at constant temperature in the test chamber 62, for example at −40° C. This allows testing of ICs at stable air temperature. In addition, it can be tested, for example, how much minimum air flow is required to limit the heating of the IC to a certain temperature. Alternatively, the air current may be reduced to zero to simulate a static system at ambient temperature.

The air outlet 76 is used to discharge the temperature control current from the contacting module 60 and, for practical purposes, is oriented so that it is directed upwards away from the contacting unit 30 in the operation state in order to prevent icing or the formation of moisture on the outer walls. The temperature control current is thus guided via the air supply 65 into the air chamber 62 and from there via the air outlet 76 out of the contacting module 60. The air supply 65 is oriented in such a way that the temperature control current is directed to the test position and the IC 200 in the test position can thus be temperature-controlled. In particular, the temperature control current is largely directed to the test position in the direction of movement of the IC 200. This allows a very stable temperature to be achieved on the surface of the IC 200. In addition, after the functional test, it is easier to move or accelerate the IC 200 in the direction of the outlet 66.

The flushing chambers 70a, 70b, 70c have air connections 71a, 71b, 71c, via which preferably temperature-controlled flushing air can be introduced into the flushing chambers 70a, 70b, 70c. The flushing chambers 70a, 70b, 70c serve to flush the test chamber 62, the first temperature sensor 64 and/or the air supply 65 with flushing air in order to avoid icing or excessive heating of the test chamber 62, the first temperature sensor 64, the air supply 65 and/or an outer wall of the contacting module 60 when a relatively cold or relatively warm temperature control current is introduced into the contacting module 60. For example, a transition region 78, which forms a transition to a test board, which is not shown, is flushed with air by means of the flushing chamber 70c. Furthermore, inlet 61 and outlet 66 are shielded against external air by means of an air curtain formed by flushing air. The air curtain is formed in the flushing chamber 70b and flows orthogonally to the orientation of inlet 61 and outlet 66. Thus the contacting module 60 remains free of ambient air, which would disturb the temperature control in the test chamber 62 in particular.

As FIG. 10b in particular illustrates, the contacting module 60 has a base 80 and a hood 85 connected to the base 80. The base 80 and the hood 85 enclose the test chamber 62. The base 80 and hood 85 are in particular detachably connected to each other, for example by means of screws. A connection between the base 80 and the hood 85 by means of quick-release fasteners is particularly advantageous. The hood 85 can therefore be easily removed from the base 80 if there is a mechanical fault in the test chamber 62 or if the test is to be carried out at room temperature. The base 80 and the hood 85 are preferably made of temperature-stable plastic.

| List of reference signs | |
|---|---|
| 10 | carrier unit |
| 11 | support element |
| 12 | foot section |
| 13 | head section |
| 14 | lock |
| 15 | spring |
| 16 | linear guide |
| 20 | probe |
| 25 | test board |
| 26 | spring module |
| 27 | spring |
| 28 | linear guide |
| 29 | screw |
| 30 | contacting unit |
| 31 | surface |
| 32 | connecting element |
| 33 | connector |
| 34 | handler unit |
| 40 | supply unit |
| 45 | cable |
| 46 | hose |
| 50 | stand |
| 51 | angle adjustment |
| 52 | guide |
| 53 | locking device |
| 54 | pivot bearing |
| 55 | handle |
| 60 | contacting module |
| 61 | inlet |
| 62 | test chamber |
| 63 | plunger |
| 64 | first temperature sensor |
| 64a | second temperature sensor |
| 65 | air supply |
| 66 | outlet |
| 67 | guide unit |
| 68 | test socket |
| 69 | nozzle |
| 70a | flushing chamber |
| 70b | flushing chamber |
| 70c | flushing chamber |
| 71a | air connection |
| 71b | air connection |
| 71c | air connection |
| 72 | spring |
| 73 | cross member |
| 74 | ram |
| 75 | light sensor |

-continued

| List of reference signs | |
|---|---|
| 76 | air outlet |
| 77 | stop device |
| 78 | transition range |
| 79 | spring |
| 80 | basis |
| 85 | cap |
| 100 | test handlers |
| 200 | IC |
| R | reference level |
| S | stand level |
| φ | angle of inclination |

The invention claimed is:

1. Contacting unit (30) for a test handler (100) for carrying out functional tests on semiconductor elements (200) having a surface, characterised by a contacting module (60) which comprises:
   an inlet (61) through which a semiconductor element (200) to be tested is introduced into the contacting module (60);
   a test chamber (62) in which the semiconductor element (200) to be tested is fixed in a test position and subjected to the functional test;
   a movably arranged plunger (63) for fixing the semiconductor element (200) to be tested in the test position;
   a first temperature sensor (64) arranged on the plunger (63) for measuring the surface temperature at the surface of the semiconductor element (200) to be tested;
   an air supply (65) for introducing a temperature control current into the test chamber (62);
   a controller for setting the temperature of the temperature control current depending on the surface temperature;
   at least one flushing chamber (70a, 70b, 70c) for flushing the test chamber (62), the first temperature sensor (64) or the air supply (65) with flushing air,
   an outlet (66) through which the semiconductor element (200) is guided out of the contacting module (60) after the functional test;
   a guide unit (67) for guiding the semiconductor element (200) to be tested inside the contacting module (60), wherein the guide unit extends from the inlet (61) via the test chamber (62) to the outlet (66); and
   wherein the movably arranged plunger (63) is configured for movement towards the semiconductor element (200) to be tested when in the test chamber for fixing the semiconductor element (200) in the test position, and away from semiconductor element (200) in the test chamber after being tested to release the semiconductor element (200) and to allow movement of the semiconductor element (200) along the guide unit (67) to the outlet (66).

2. Contacting unit (30) according to claim 1, further characterised by the guide unit (67) having a test socket (68) forming the test position in the region of the test chamber (62).

3. Contacting unit (30) according to claim 2, characterised in that the guide unit (67) in the region of the test chamber (62) is mounted by means of at least one spring (79), the guide unit (67) with the semiconductor element (200) to be tested being movable by the plunger (63) towards the spring (79) in order to compress the spring (79).

4. Contacting unit (30) according to claim 2, characterised by at least one nozzle (69) for introducing a flow into the guide unit (67) in order to move the semiconductor element (200) to be tested along the guide unit (67).

5. Contacting unit (30) according to claim 1, characterised in that the first temperature sensor (64) is mounted in the plunger (63) biased by a spring (72), the plunger (63) being arranged in such a manner that it faces a top face or a bottom face of the semiconductor element (200) to be tested when it is arranged in the test position.

6. Contacting unit (30) according to claim 1, characterised by a movably arranged cross member (73) which moves the plunger (63) towards the test position in order to fix the semiconductor element to be tested in the test position.

7. Contacting unit (30) according to claim 6, wherein the cross member (73) is configured to be actuated by at least one ram (74).

8. Contacting unit (30) according to claim 7, wherein the at least one ram (74) comprises a temperature-stable material.

9. Contacting unit (30) according to claim 1, further characterised by a sensor, for detecting whether the semiconductor element (200) to be tested is arranged in the test position.

10. Contacting unit (30) according to claim 9, wherein the sensor comprises a light sensor (75).

11. Contacting unit (30) according to claim 1, characterised in that the contacting module (60) has a base (80) and a hood (85) detachably connected to the base, wherein the test chamber (62) is enclosed by the base (80) and the hood (85).

12. Contacting unit (30) according to claim 11, characterised in that the base (80) or the hood (85) are made of a temperature-stable plastic.

13. Contacting unit (30) according to claim 12, wherein the base (80) or the hood (85) are made of polyetheretherketone (PEEK) or polyphenylene sulphide (PPS).

14. Contacting unit (30) according to claim 13, further wherein the base (80) or the hood (85) are glass fibre-reinforced.

15. Contacting unit (30) according to claim 1, characterised in that the air supply (65) is aligned to direct the temperature control current to the test position so as to temper the semiconductor element (200) in the test position.

16. Contacting unit (30) according to claim 1, characterised by at least one air connection (71a, 71b, 71c) for introducing flushing air into the flushing chamber (70a, 70b, 70c).

17. Contacting unit (30) according to claim 16, characterised by an air outlet (76) for discharging the temperature control current from the contacting module (60).

18. Contacting unit (30) according to claim 17, wherein the air outlet (76) is directed upwards and away from the contacting unit (30) in the operating state of the handler unit (30).

19. Contacting unit (30) according to claim 1, characterised by a movably arranged stopping device (77) which stops the semiconductor element (200) to be tested when it reaches the test position.

20. Contacting unit (30) according to claim 1, characterised by a transition region (78) which can be flushed with air by means of the flushing chamber (70a, 70b, 70c), the transition region (78) forming a transition to a test board.

21. Contacting unit (30) according to claim 1, characterised in that the inlet (61) or the outlet (66) are shielded against extraneous air by means of an air curtain formed by flushing air.

22. Contacting unit (30) according to claim 1, characterised by a second temperature sensor (64*a*) for measuring the air temperature in the test chamber (62).

23. Method for controlling a contacting unit (30), wherein the contacting unit is defined according to claim 1, the method comprising measuring the surface temperature at the surface of a semiconductor element (200) to be tested with the first temperature sensor (64) arranged on the plunger (63), and controlling the temperature of the temperature control current depending on the measured surface temperature.

24. Method according to claim 23, characterised in that the surface temperature is measured by means of the first temperature sensor (64) directly on the surface of the semiconductor element (200) to be tested, the surface being contacted by the first temperature sensor (64) in a contacting manner at least at one point.

* * * * *